United States Patent [19]

Kringel et al.

[11] 4,282,560
[45] Aug. 4, 1981

[54] LIGHT DISTRIBUTOR

[75] Inventors: George N. Kringel, Westport; Nicholas E. Sachuk, Stamford, both of Conn.

[73] Assignee: A.C.A. Products, Inc., Riverside, Conn.

[21] Appl. No.: 162,204

[22] Filed: Jun. 23, 1980

Related U.S. Application Data

[63] Continuation of Ser. No. 3,214, Jan. 15, 1979, abandoned.

[51] Int. Cl.³ ............................................. G01D 11/28
[52] U.S. Cl. ........................................ 362/26; 362/31; 362/157; 362/311
[58] Field of Search .................... 362/26, 31, 157, 311

[56] References Cited

U.S. PATENT DOCUMENTS 3,526,762  9/1970  Blackwell ............................... 362/31

Primary Examiner—Stephen J. Lechert, Jr.
Attorney, Agent, or Firm—St. Onge, Steward, Johnston, Reens & Noë

[57] ABSTRACT

A light distributor is described for use in distributing light from a source in a generally uniform manner across an edge, to for example, illuminate an array of light sensitive elements. The light distributor can be made of a transparent plastic material and is formed with a light guide and a lamp supporting segment. The light guide has a pair of planar faces bounded by sides of a curvature, which bears a particular relationship with a light source region in the lamp supporting segment so as to distribute light therefrom across the edge. A cost effective efficient light distributor is described, particularly for use in activating photocells arranged in an array in a shaft encoder.

25 Claims, 6 Drawing Figures

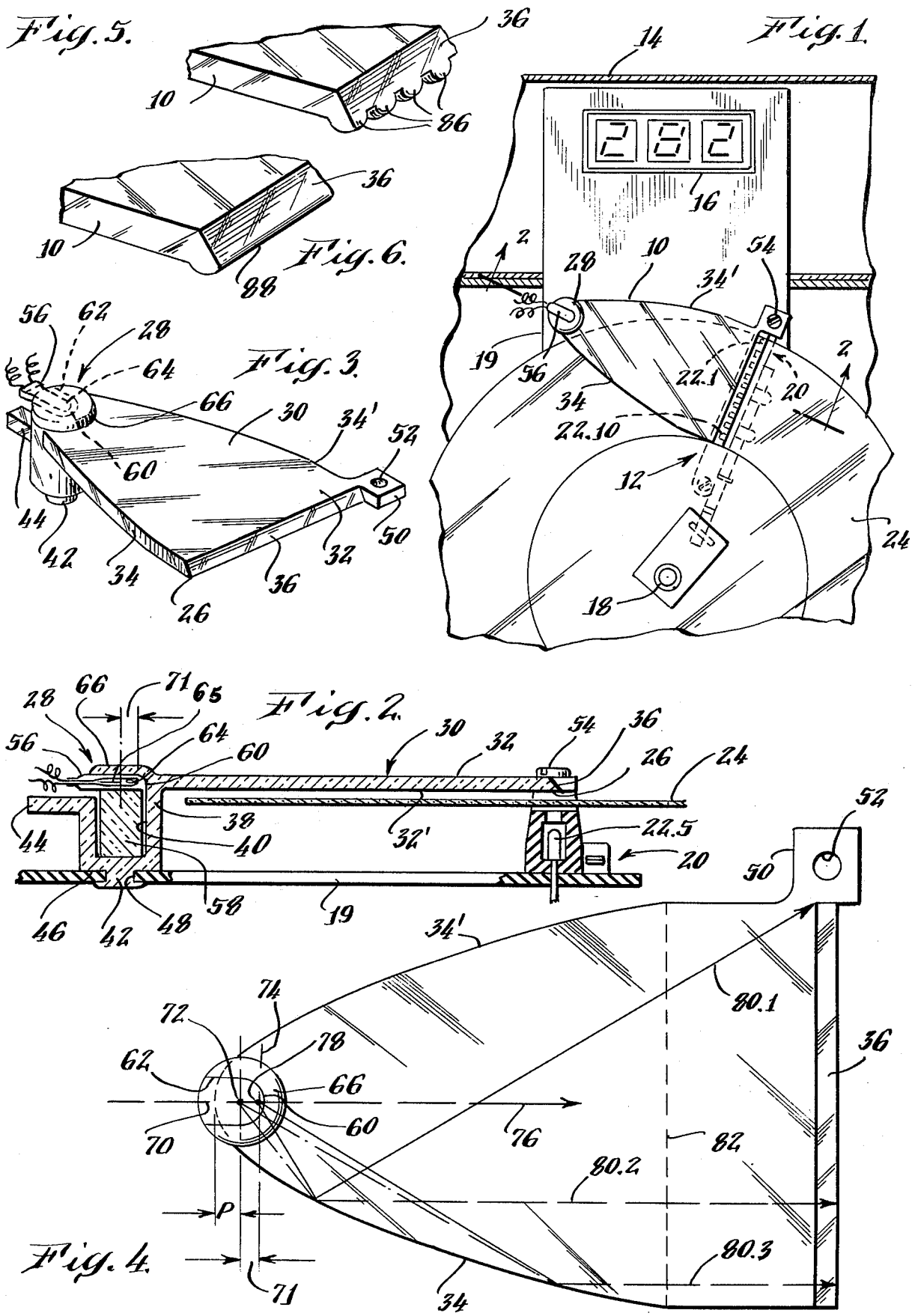

LIGHT DISTRIBUTOR

This is a continuation of application Ser. No. 3,214 filed Jan. 15, 1979 now abandoned.

FIELD OF THE INVENTION

This invention generally relates to light sensing and more specifically to the illumination of light detectors.

BACKGROUND OF THE INVENTION

Light detectors are well known and involve a light sensitive element, such as a photocell, which is actuated by a light source. Light detectors are used in a great variety of applications including shaft encoders in which an optically coded disc is moved over an array of photo detectors whose outputs define the relative position of the coded disc. Paraboloid (three dimensional) light reflectors are well known for focusing of light such as produced in flashlights.

In a common arrangement for an array of photocells, a plurality of light sources are used, one for each photocell in the array. In certain applications, however, such multiple light sources are impractical for reasons of economy, space or reliability. A longitudinal light source such as a flourescent light could be used for illuminating an array of photocells, but such light source is not conveniently employed in a cost effective application.

In certain products such as consumer wares, the product's safety, cost effectiveness, convenience of installation, reliability and efficiency often can make the difference between a successful and unsuccessful product. For example, in the production of a digital bathroom scale for use in the home, it is important that the scale is safe and convenient to use. Electrical power is needed to drive the scale's shaft encoder and when this power is derived from a conventional AC outlet, additional components to provide a safe product increase the product expense, especially when the high voltage is run directly into circuits inside the scale. Even the use of an AC to low voltage DC socket mounted converter, as are commonly used to drive small appliances, though safe to use, increases scale cost, and requires scale attachment to a wire which some customers are likely to find impractical.

Use of a battery driven shaft encoder, however, imposes difficulties such as a need to minimize power utilization to conserve the batteries and stretch out time intervals between battery changes. Such low power drain must be compromised with the need to provide a satisfactory light intensity needed to actuate photocells as may be employed in the shaft encoder. Use of a plurality of light sources to actuate the photocells can be used, but these tend, on the aggregate, to impose a higher electrical power drain and with the need of appropriate components and mountings with lamps or light emitting diodes, additional costs.

SUMMARY OF THE INVENTION

With a light distributor in accordance with the invention, an array of light sensitive elements can be serviced with a single light source driven by a low DC voltage. The light produced from the source is evenly distributed along a longitudinal edge of a light guide.

As described herewith with respect to a light distributor in accordance with the invention, a light transparent guide is provided which intercepts light from a lamp supporting segment to guide the light along a light guiding direction to a longitudinal guide edge. The light guide has opposite planar faces bounded by sides, at least one of which diverges from the vicinity of the lamp supporting segment along a curve selected so that light emanating from a light source region in the lamp supporting segment and incident upon the diverging side is reflected thereby in a generally uniform manner across the longitudinal guide edge.

The light source region has a predetermined location with respect to the diverging portion of the light guide side so that light from the glowing filament of a conventional low voltage lamp seated in the lamp supporting segment may contribute constructively towards the uniform illumination of the light guide's longitudinal edge.

In one light distributor in accordance with the invention for use in the illumination of an array of photocells, the light guide has opposite sides, which bound the planar guide faces, and diverge from the lump supporting segment so that each side contributes light to the longitudinal guide edge. The sides are curved with a curvature, such as parabolic or elliptic, with the lamp supporting segment so located that a light source can be seated in a region extending inwardly towards the longitudinal guide edge from the focal point of the curve formed by the light guide sides. The lamp supporting segment has lamp seating surfaces, one of which locates the light source at a level located between the planar faces of the light guide. Hence, when a lamp is placed in the lamp supporting segment, the filament is located in the light source region. When the lamp is activated, the filament's illumination is evenly distributed, both by direct incidence and reflection from the sides across the longitudinal edge of the light guide.

With a light distributor in accordance with the invention, conventional low voltage lamps can be employed. The location of the filament in the lamp may vary, yet a sufficiently uniform distribution of light along the longitudinal guide edge is obtained to activate each of light detectors arranged in an array in alignment with the edge.

The light guide may be conveniently formed of a molded transparent plastic material. As a result, the light guide can be cost-effective as well as an efficient distributor of light.

It is therefore, an object of the invention to provide a cost effective, convenient light distributor which can spread a source of light, such as a conventional, low voltage light bulb, in a generally uniform and efficient manner across an edge of the guide.

These and other advantages and objects of the invention can be understood from the following detailed description of a preferred embodiment which is described in conjunction with the following drawings.

BRIEF DESCRIPTION OF DRAWINGS

FIG. 1 is a plan view of a light distributor in accordance with the invention as used in a shaft encoder for illuminating an array of light sensitive elements;

FIG. 2 is a section view of the light distributor taken along the line 2—2 in FIG. 1;

FIG. 3 is a perspective view of a light distributor in accordance with the invention;

FIG. 4 is an enlarged plan view of the light distributor shown in FIG. 3; and

FIGS. 5 and 6 are partial perspective views of the guide edge end of a light guide with an integrally molded lens.

DETAILED DESCRIPTION

With reference to FIGS. 1 and 2, a light distributor 10 is shown operatively mounted in a shaft encoder 12 used in a bathroom scale 14 to provide a digital indication of the weight of a person through a display 16 of the rotation of a shaft 18. The scale 14 may be formed as described in greater detail in a co-pending patent application entitled "Self-Contained Portable Electrically Sensed Bathroom Scale" by John E. Pfeiffer and assigned to the same assignee as of this invention.

The shaft encoder 12 is mounted on a circuit board 19 and includes an array 20 of light sensitive elements such as photocells 22 arranged to sense light from the light distributor 10 through a coded disc 24. The photocells 22 are located to each respond to optical codings arranged in a circular channel on the coded disc 24. The electrical outputs from photocells 22 define the amount of rotation of shaft 18 and thus the weight of a person standing on the scale 14.

Illumination of the array of photocells 22 is provided by light distributor 10 which directs, from a guide edge 26, a band of light in alignment with the photocell array 20. The individual photocells 22 respond to light from edge 26 in accordance with the optical codings on disc 24. The light distributor 10 is formed of a lamp supporting segment 28 and a light guide 30 which guides light from segment 28 to guide edge 26.

Light guide 30 has a pair of planar faces 32, 32' bounded by sides 34, 34'. The planar faces 32, 32' extend from the lamp supporting segment 28 to guide edge 26 where a beveled edge 36 is provided to reflect light downwardly along edge 26. The beveled edge 36 is provided to reflect light downwardly along edge 26. The beveled edge 36 is preferably polished to form a good reflector of light passed through light guide 30. The planar faces 32 may be aligned to converge towards each other with greater separation near the lamp support segment 28. This has the advantage of capturing more light from a light source mounted in segment 28. However, since this involves a greater thickness and consequently more material and mold retention time, planar faces 32, 32' preferably are parallel with a separation sufficient to conduct light and form a rigid structure. A thickness of the order of about 0.1 inch has been found useful.

The lamp supporting segment 28 is formed of a hollow cylindrical post 38 having a recess 40, a fastening protrusion 42 and a wire spacer 44. The protrusion 42 extends below a seating surface 46 and fits through a suitable hole 48 in board 19. The post 38 is attached to board 19 by heat deforming protrusion 42 as illustrated in FIG. 2. The wire spacer 44 preserves separation of the wires.

Post 38 is integrally molded with light guide 38 to form a unitary structure and enable the light guide to extend in cantilever fashion over the coded disc 24. An extension 50 having a hole 52 is formed near the guide edge 26 to enable attachment to array 20 for a second support from board 19 with a screw 54 passed through hole 52.

A lamp 56 is placed on a loose fitting support 58 placed in recess 40. The lamp 56 is seated against a cylindrical locating surface 60 of a slot 62. The height of support 58 is selected so that the filament 64 of lamp 56 is at a vertical height between planar surfaces 32, 32'. The lamp 56 is locked into place by heat-deforming a surrounding ridge 66 over the lamp 56 with a suitable heat source. The lamp 56 is preferably so oriented that the maximum amount of illumination from filament 64, which preferably is one of the spiral wound type, can be directed towards the light guide 30. In the illustrated light distributor 10, the lamp 56 is placed to rest on its side on support 58 so that maximum illumination from filament 64 can be directed along a lamp axis 65, around which filament 64 is wound, towards light guide 30 and thus guide edge 26. The surrounding ridge 66 enhances the collection of light from lamp 56 and subsequent guidance towards edge 26.

The effectiveness of light distributor 10 in distributing light from lamp support segment 28 is further enhanced by shaping sides 34, 34' into curves which enable light from filament 64 to be reflected across guide edge 26. This entails, in the illustrated light guide 30, parabolic shaped sides 34, 34' having a vertex 70 and a focus 72. The lamp seating edge 60 in slot 62 is so placed that filament 64 is located in a light source region 71 extending between focus 72 and about twice the focal distance, P, from vertex 70, i.e. up to about a line 74.

The lamp 56 having a spiral filament 64 is placed in slot 62 with the filament 64 normally located in the light source region 71 and preferably centered on the parabolic axis 76. In such case light from, for example, a point at 78 and incident upon side 34 is generally uniformly distributed by both direct incident rays and reflected rays, such as 80.1 and 80.2 over the entire guide edge 26. The sides 34, 34' engage lamp support segment 28 in the vicinity of a plane transverse to axis 76 and including the focus 72.

With the location of a lamp filament 64 in the light source region 71 the occurrence of bright and dark bands of light across the light guide edge 26 is sufficiently avoided to assure proper actuation of photocells 22 in the entire array 20. This is achieved even though the location of the filaments 64 cannot be consistently determined because of production tolerance variations. The light source region 71 has sufficient length and width to permit some displacement of filament locations. Good light distribution is obtained when the filament is located at a preferred position near line 74 of the region 71.

The light source region 71 may thus be considered as generally bounded by the planar faces 32, 32' and the points 72, 78 on axis 76. Further light utilization from a lamp 56 can be obtained by a roughening of the internal surface of slot 62. This tends to diffuse light from filament 64 to enhance light distribution.

The curvature of sides 34, 34' is carried out to such distance as appears necessary to obtain a generally uniform illumination of guide edge 26. In the illustrated embodiment, curvature of sides 34, 34' is carried out to a line generally at 82 beyond which light rays are incident at greater than critical angles and thus would be totally reflected.

Beyond line 82 the light guide has obtained a width comparable to that needed to illuminate the array 20 of photocells. The curvature and dimensional requirements of light guide 30 are thus selected depending upon particular requirements of light guide 30.

For example, in the illustrated embodiment, the sides 34 follow a parabolic curvature of $x = y^2/4P$ where x is measured along the axis 76 and y is perpendicular to axis 76. The value of P is about 0.1 inches or about 2.5 mm.

The curvature 34, 34' need not be parabolic and may have such other curvature, for example elliptic, as will achieve a generally uniform distribution of light across guide edge 26. The light conducted by light guide 30 in the embodiment is reflected downward by polished edge 36. One may utilize several such edges spaced along the guide by forming triangular shaped grooves in guide 30. A single side 32 may have such curvature.

Having thus described a light distributor in accordance with the invention, its advantages can be appreciated. Variations from the embodiment can be made. For example, lenses 86 (see FIG. 5) may be molded along light edge 26 to enhance the concentration of light. Though such concentration enhances the light intensity on photocells 22, the latter must be more carefully positioned relative to such lenses to obtain their beneficial intensity enhancement. The entire light guide edge 26 may, for example, be provided with a longitudinal cylindrical lens 88 (see FIG. 6), thus increasing the light intensity along one axis but preserving a uniform edge illumination for easier photocell placement along edge 26.

The entire light distributor 10 is conveniently formed of a transparent molded plastic material enabling injection molding techniques to achieve a cost effective unit. Low power draining lamps may be employed. The light guide can be formed of an inverted female version of the light guide embodiment as shown in the drawings. The light distributor can be used reversely; i.e. by concentrating light from different sources at the guide edge onto a central region, modulated light sources can be used.

What is claimed:

1. A light distributor to provide a desired distribution of light from a lamp comprising
   a lamp supporting segment, said lamp supporting segment including a light source region in which said lamp can be placed with said light source region having a predetermined dimension along a light guiding direction; and
   a generally planar light guide extending along the light guiding direction to intercept and guide light from the lamp supporting segment to a longitudinal guide edge, said light guide having planar faces bounded by sides at least one of which sides, commencing in the vicinity of the lamp supporting segment, diverges from the lamp supporting segment along a predetermined curve, said curve being selected so that light intercepted by the light guide from the light source region in the lamp supporting segment and incident upon said at least one side is reflected from said at least one side in a generally uniform manner across the longitudinal guide edge to establish at and emit from said edge at even distribution of light emanating from the light source region of said lamp supporting segment.

2. The light distributor as set forth in claim 1 wherein both sides of the light guide diverge from said lamp supporting segment in a generally similar manner to enhance the intensity and uniform distribution of light at said guide edge.

3. The light distributor as set forth in claim 3 wherein said longitudinal edge is beveled to reflect light along a band of one face of said light guide.

4. The light distributor as set forth in claim 2 wherein said sides lie along a curve having a vertex and a focus, said light source region extending from said focus towards said guide edge.

5. The light distributor as set forth in claim 4 wherein said light source region extends for a distance generally about equal to the distance between the vertex and said focus.

6. The light distributor as set forth in claim 2 wherein said lamp supporting segment has a cylindrically shaped lamp seating surface.

7. The light distributor as set forth in claim 6 wherein said lamp seating surface is roughened to diffuse light emanating from the light source region.

8. The light distributor as set forth in claim 2 wherein said lamp supporting segment is formed with a post having a seating surface and a deformable protrusion extending past the seating surface for attachment of the light distributor.

9. The light distributor as set forth in claim 8 wherein said post is hollow, and further including a lamp support sized to fit in said hollow and place a lamp in said light source region.

10. The light distributor as set forth in claim 1 and further including a lens element molded at said guide edge to concentrate light therefrom.

11. The light distributor as set forth in claim 10 wherein said lens is formed of a plurality of lenses.

12. The light distributor as set forth in claim 2 wherein said lamp supporting segment includes an incandscent lamp having a filament which is spiral wound about a lamp axis and a front end, said lamp being so oriented such that said front end of the lamp faces the planar light guide with the lamp axis aligned generally in the plane of said light guide.

13. The light distributor as set forth in claim 12 and further including an array of photocells arranged in alignment with said longitudinal edge to respond to light uniformly distributed therealong.

14. The light distributor as set forth in claim 13 wherein the light guide longitudinal edge is beveled to reflect light conducted through the guide in a narrow band through a planar face of the light guide, said array of photocells being disposed in alignment with said narrow band to respond to light therein.

15. The light distributor as set forth in claim 14 wherein said light guide is formed of a molded transparent plastic material.

16. In a bathroom scale employing a battery powered digital scale weight indicator wherein light from a lamp powered by the battery is distributed over an array of light sensitive cells used to measure the mechanical deflection of the scale, the improvement comprising
   a lamp supporting segment to which said lamp can be mounted;
   a generally planar light guide extending along a light guiding direction from a light intercepting location in the vicinity of the lamp supporting segment to a longitudinal light emitting edge operatively disposed to activate said light sensitive cells, said light guide having planar faces bounded by sides, at least one of which sides, commencing in the vicinity of the lamp supporting segment, diverges from the latter segment along a predetermined curve, said curve being selected so that light intercepted between the planar faces of the light guide and incident upon said one side is reflected therefrom in a generally uniform manner across the longitudinal light emitting edge to establish at and emit from said latter edge an even distribution of light emanating from the lamp supporting segment.

17. The improvement as set forth in claim 16 wherein said light guide is provided with a beveled edge along a plane which intersects the planar faces at an angle which reflects light in the light guide in a band onto one of the planar faces along said light emitting edge.

18. The improvement as set forth in claim 17 wherein said light guide is provided at said one planar face onto which light is reflected with a plurality of lens elements distributed along said light emitting edge to focus light onto the light sensitive cells.

19. The improvement as set forth in claim 17 wherein said light guide is provided at said one planar face with a longitudinal lens extending coextensively with the beveled edge.

20. A light distributor for use in a bathroom scale employing a battery powered digital scale weight indicator wherein a light from a lamp powered by the battery is distributed over an array of light sensitive cells used to measure a mechanical deflection of the scale, comprising a light conducting plastic molded light distributor having a lamp supporting segment and a generally planar light guide extending from the lamp supporting segment along a light guiding direction to a longitudinal light emitting edge of the light guide operatively disposed to activate the light sensitive cells, said light guide being of generally planar shape with planar faces bounded by sides which, commencing in the vicinity of the lamp supporting segment, diverge therefrom along a predetermined curve, said curve being selected so that light intercepted by the light guide from the lamp supporting segment and incident upon the diverging sides reflected therefrom in a generally uniform manner across the longitudinal light emitting edge of the light guide to establish at said edge an even distribution of light emanating from a lamp mounted at said lamp supporting segment, said light guide being provided with a beveled edge between the planar faces and oriented to reflect light guided by the planar faces and the sides towards one of said planar faces along said longitudinal light emitting edge.

21. The light distributor as set forth in claim 20 wherein said beveled edge is oriented generally transversely to said light guiding direction.

22. The light distributor as set forth in claim 21 wherein said planar faces are parallel.

23. In a bathroom scale employing a digital scale weight indicator wherein light from a lamp is distributed over an array of light sensitive cells used to measure the amount of rotation of an optically coded disc rotated in light intercepting relationship with respect to the light sensitive cells in response to the mechanical deflection of the scale, the improvement comprising a lamp support to which said lamp can be mounted;
a light guide extending along a light guiding direction from a light intercepting location in the vicinity of the lamp support to a longitudinal light emitting edge operatively disposed with respect to the light sensitive cells for their activation, said light guide having upper and lower faces bounded by lateral sides, at least one of said sides diverging in a predetermined manner from the vicinity of the lamp support and relative to the light guiding direction so that light intercepted between the upper and lower faces of the light guide and incident upon said at least one side is reflected therefrom for guidance by the light guide to and along the longitudinal light emitting edge to establish from said edge a distribution of light sufficient to activate the light sensitive cells in the array.

24. A light distributor for use in a bathroom scale employing a battery powered digital scale weight indicator wherein light from a lamp powered by the battery is distributed over an array of light sensitive cells used to measure the amount of rotation of an optically coded disc rotated in light intercepting relationship with respect to the light sensitive cells in response to the mechanical deflection of the scale, comprising a lamp support to which said lamp can be mounted;
a light guide extending along a light guiding direction from a light intercepting location in the vicinity of the lamp support to a longitudinal light emitting edge operatively disposed with respect to the light sensitive cells for their activation, said light guide having parallel faces bounded by sides; said sides, commencing in the vicinity of the lamp support, diverging relative to the light guiding direction along a direction which is selected so that light intercepted between the parallel faces of the light guide and incident upon said sides is reflected therefrom for guidance by the light guide to and along the longitudinal light emitting edge to establish from said edge a distribution of light sufficient to activate the light cells in the array.

25. In a bathroom scale employing a battery powered digital scale weight indicator wherein light from an incandescent lamp having a filament and powered by the battery is distributed over an array of light sensitive cells used to measure the amount of rotation of an optically coded disc rotated in light intercepting relationship with respect to the light sensitive cells in response to the mechanical deflection of the scale, the improvement comprising a lamp support on which said lamp is operatively mounted with the lamp filament in a light source region;
a light guide extending along a light guiding direction from the light source region to intercept and guide light from the lamp filament to a longitudinal light emitting guide edge; said latter edge being located in alignment with the array of light sensitive cells for their activation; said light guide having parallel faces bounded by sides which, commencing in the vicinity of the lamp support, diverge with respect to the light guiding direction and from each other along a direction which is selected so that light intercepted between the parallel faces of the light guide at the light source region and incident upon said sides is reflected therefrom for guidance by the light guide to and along the longitudinal light emitting edge to establish from said edge a distribution of light from the light source region sufficient to activate the light sensitive cells in the array.

* * * * *